(12) United States Patent
Palawinna et al.

(10) Patent No.: US 10,637,121 B2
(45) Date of Patent: Apr. 28, 2020

(54) BROADBAND SIGNAL TAP

(71) Applicant: Technetix B.V., Veenendaal (NL)

(72) Inventors: Chandith Palawinna, Burgess Hill (GB); Gareth Shelley, Brighton (GB); Paul Chapman, East Grinstead (GB)

(73) Assignee: Technetix B.V., Veenendaal (NL)

( * ) Notice: Subject to any disclaimer, the term of this patent is extended or adjusted under 35 U.S.C. 154(b) by 27 days.

(21) Appl. No.: 15/906,249

(22) Filed: Feb. 27, 2018

(65) Prior Publication Data

US 2018/0254538 A1    Sep. 6, 2018

(30) Foreign Application Priority Data

Mar. 2, 2017    (GB) .................................. 1703394.5

(51) Int. Cl.
| | |
|---|---|
| *H01P 5/00* | (2006.01) |
| *H05K 5/03* | (2006.01) |
| *H05K 7/14* | (2006.01) |
| *H05K 1/02* | (2006.01) |
| *H01P 5/18* | (2006.01) |
| *H01R 13/6466* | (2011.01) |
| *H01R 24/44* | (2011.01) |

(52) U.S. Cl.
CPC ................ *H01P 5/00* (2013.01); *H01P 5/184* (2013.01); *H05K 1/0237* (2013.01); *H05K 5/03* (2013.01); *H05K 7/1427* (2013.01); *H01R 13/6466* (2013.01); *H01R 24/44* (2013.01)

(58) Field of Classification Search
CPC ......... H01P 5/00; H01P 5/184; H05K 1/0237; H05K 5/03; H05K 7/1427; H01R 13/6466; H01R 24/44

USPC ......................................................... 333/260
See application file for complete search history.

(56) References Cited

U.S. PATENT DOCUMENTS

| | | | | |
|---|---|---|---|---|
| 3,349,345 | A | 10/1967 | Winegard | |
| 4,755,776 | A | 7/1988 | Preschutti | |
| 5,909,154 | A | 6/1999 | Brown et al. | |
| 6,049,693 | A * | 4/2000 | Baran ................... | H04N 7/102 348/E7.052 |
| 6,262,636 | B1 | 7/2001 | McLain et al. | |
| 8,646,018 | B2 * | 2/2014 | Menna ................... | H01P 3/081 174/382 |

(Continued)

FOREIGN PATENT DOCUMENTS

| | | |
|---|---|---|
| CN | 201878277 U | 6/2011 |
| CN | 203108868 U | 8/2013 |

(Continued)

OTHER PUBLICATIONS

English language abstract of Chinese Utility Model Publication No. CN 201878277 U, European Patent Office, dated Jun. 22, 2011.

(Continued)

*Primary Examiner* — Robert J Pascal
*Assistant Examiner* — Kimberly E Glenn
(74) *Attorney, Agent, or Firm* — DASCENZO Intellectual Property Law, P.C.

(57) ABSTRACT

There is provided a broadband signal tap comprising a housing and a cover adapted to be removable from and attachable to the housing, the housing comprising a power continuity connector and the cover comprising at least one external subscriber port, wherein a floating RF coupler is disposed proximal to the power continuity connector.

14 Claims, 5 Drawing Sheets

(56) References Cited

U.S. PATENT DOCUMENTS

| | | | |
|---|---|---|---|
| 2005/0034167 A1* | 2/2005 | Weinstein | H04N 7/104 725/129 |
| 2011/0095840 A1* | 4/2011 | Degtyarev | H03H 7/383 333/32 |
| 2013/0276050 A1 | 10/2013 | Menna et al. | |

FOREIGN PATENT DOCUMENTS

| | | |
|---|---|---|
| EP | 1001543 A1 | 5/2000 |
| GB | 2394849 A | 5/2004 |
| GB | 2523165 A | 8/2015 |
| JP | 2005019496 A | 1/2005 |
| WO | WO 2004/036794 A1 | 4/2004 |

OTHER PUBLICATIONS

English language abstract of Chinese Utility Model Publication No. CN 203108868 U, European Patent Office, dated Aug. 7, 2013.
Poland Search Report issued in connection with Polish Patent Application No. P 424664, Patent Office of the Republic of Poland, dated Jul. 5, 2018.
English-language abstract of Japan Patent Publication No. JP 2005019496 A, European Patent Office, dated Jan. 20, 2005.
United Kingdom Search Report issued in connection with United Kingdom Patent Application No. GB1703394.5, United Kingdom Intellectual Property Office, dated Aug. 17, 2017.

* cited by examiner

BROADBAND SIGNAL TAP

RELATED APPLICATION

This application claims priority under 35 U.S.C. § 119 to United Kingdom Patent Application No. 1703394.5, which was filed on Mar. 2, 2017, and the complete disclosure of which is hereby incorporated by reference.

FIELD

This disclosure relates to a broadband signal tap of the type used in cable television and broadband networks.

BACKGROUND

To address demand for transport of increasing amounts of broadband data over communication networks, broadband and cable television network operators need to upgrade their networks to extend the operating frequency range and so increase the bandwidth. When upgrading networks, it is preferred to use existing infrastructure to reduce the overall cost of the upgrade.

For signal taps, such as line distribution taps, increasing the bandwidth is usually achieved by replacing the existing face plate of the tap with an upgraded face plate designed to work for a higher range of frequencies, typically up to 1218 MHz and higher. However resonant effects occur with the components situated in the unmodified tap back box and this degrades signals passing through the tap which is undesirable.

It is the aim of the present disclosure to reduce the signal degradation experienced in such an arrangement.

SUMMARY

Broadband signal taps, covers for broadband signal taps, and housings for broadband signal taps are disclosed.

Some broadband signal taps according to the present disclosure comprise a housing and a cover adapted to be removable from and attachable to the housing. The housing comprises a power continuity connector, and the cover comprises at least one external subscriber port. A floating RF coupler is disposed proximal to the power continuity connector.

Some covers according to the present disclosure comprise electrical components, at least one external subscriber port, and an insulating sheath disposed over the electrical components. A floating RF coupler is located on an outer face of the insulating sheath so as to be electrically isolated from the electrical components within the sheath.

Some housings according to the present disclosure comprise a power continuity connector and an insulating sheath on which is located a floating RF coupler so as to be proximal to the power continuity connector.

DESCRIPTION

Figure 1:
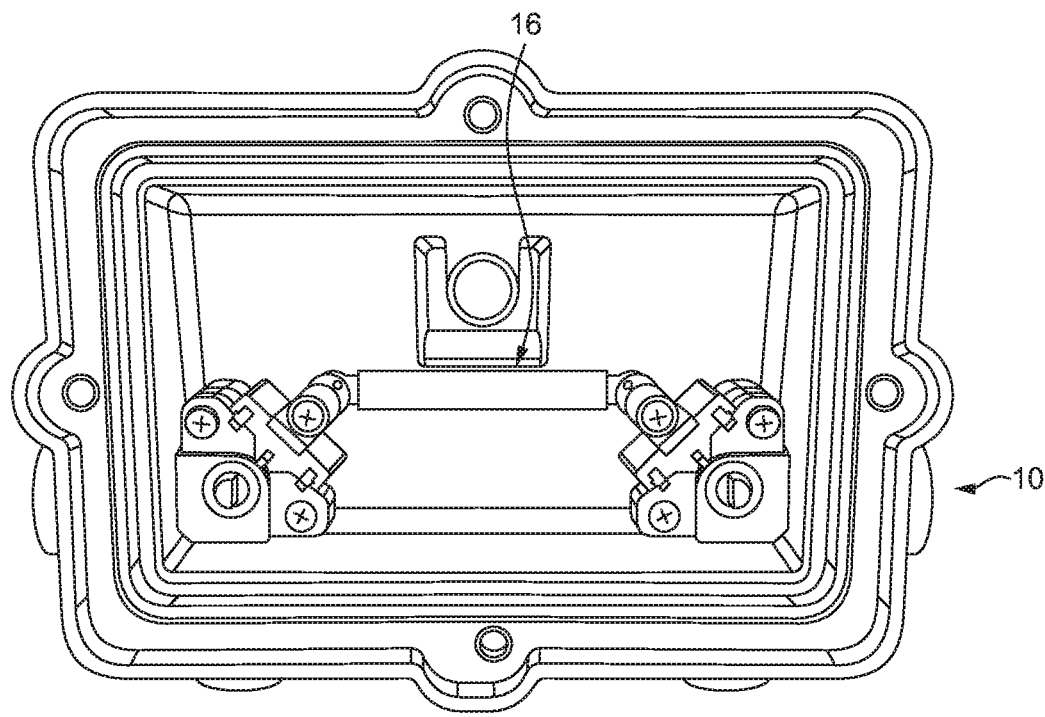
FIG. 1 shows a plan view of a back box forming part of a broadband signal tap.

In accordance with the first aspect of the disclosure, there is provided a broadband signal tap comprising a housing, typically a back box, and a cover, typically a face plate, adapted to be removable from and attachable to the housing, the housing comprising a power continuity connector or bar and the cover comprising at least one external subscriber port, wherein a floating RF coupler is disposed proximal to the power continuity connector thereby to prevent resonance occurring between electrical components situated in the housing and electrical components situated on the face plate.

By having a floating RF coupler which is unconnected to ground, earth or any voltage, resonant effects due to interference between electrical components in the housing and the cover can be substantially reduced and signal degradation from such resonant effects substantially reduced.

The housing may further comprise electrical components adapted to process signal frequencies in a first range with the cover adapted to process signal frequencies in a second range, the second range of frequencies partially overlapping with the first range of frequencies and extending beyond the first range of frequencies. Preferably the first range will have an upper limit of 1000 MHz and the second range extends to at least 1218 MHz or preferably higher.

The cover may further comprise an insulating sheath or mount, typically in the form of plastics material, disposed over electrical components associated with the cover, and the floating RF coupler may be located on an outer surface of the insulated sheath so as to be positioned proximal to the power continuity connector.

In accordance with another aspect of the disclosure, there is provided a cover, such as a face plate, comprising electrical components, at least one external subscriber port and an insulating sheath disposed over the electrical components, wherein a floating RF coupler is located on an outer face of the insulating sheath.

The sheath may be shaped to ensure the floating RF coupler is positioned proximal to a power continuity connector when the cover is connected to a cable housing tap.

For such a cover, the electrical components process signal frequencies may extend to at least 1218 MHz.

In some examples, the floating RF coupler is located within the cover or face plate as this is the component that will be replaced when a system is upgraded.

Alternatively, the floating RF coupler can be mounted on an insulating sheath locatable within a housing. Thus, on upgrading of a tap, the existing face plate will be removed, the floating RF coupler on the insulating sheath inserted into the back box so as to be proximal to the power continuity bar and then an updated face plate secured to the housing.

Thus, in accordance with another aspect of the disclosure, there is provided a floating RF coupler mounted on an insulating sheath for insertion into a back box of a broadband signal tap.

In some examples, the floating RF coupler is linked to a resistive means, such as a resistor, the resistive means acting to dissipate energy and so acting as a damping resistor.

The floating coupler and linked resistor may be formed on a printed circuit board.

In some examples, the floating RF coupler comprises (optionally consists of) a copper track connected to a resistor, the copper track and resistor forming a closed electrical path.

Figure 5:
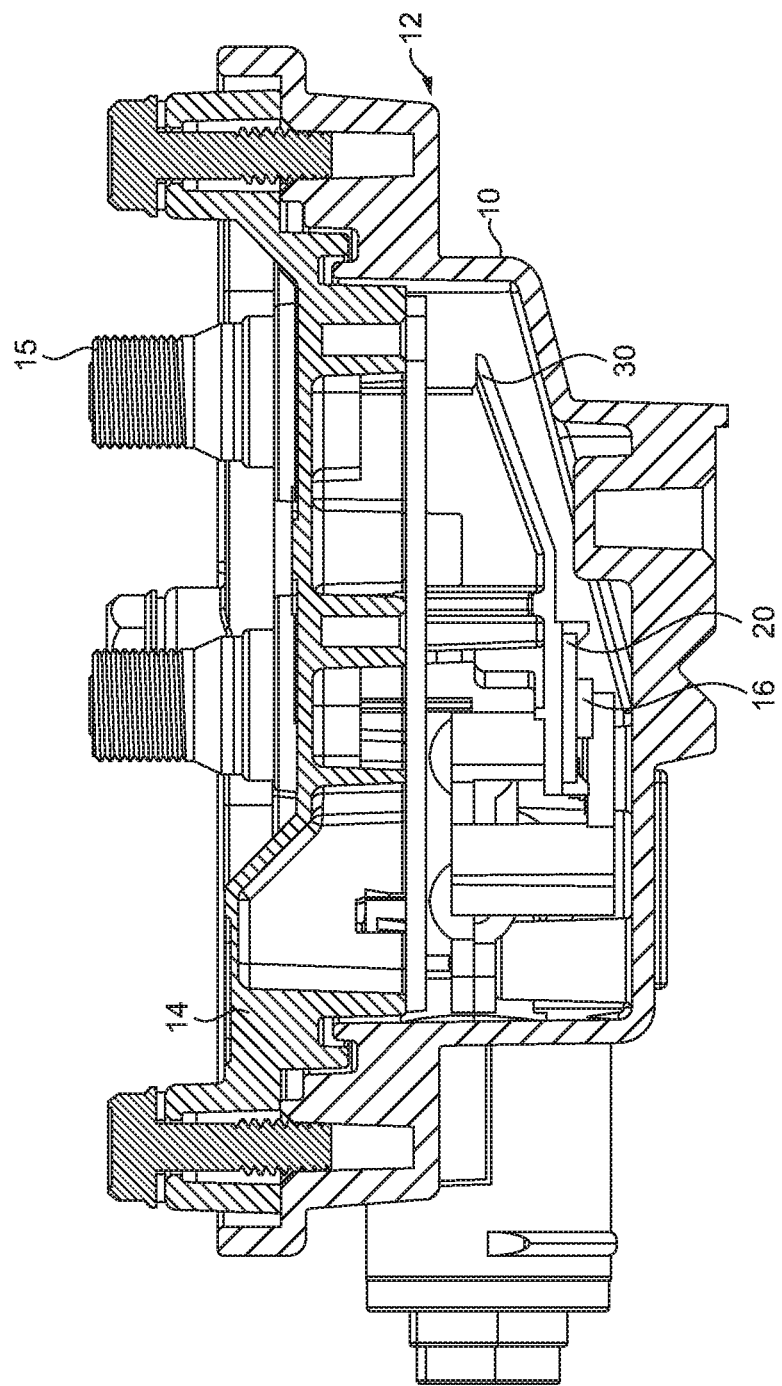
FIG. 5 shows a cross-section through a broadband signal tap incorporating a floating RF coupler.

FIG. 1 shows a back box 10 being part of a signal distribution tap 12 which is used in conjunction with a face plate 14, see FIG. 5, which has a plurality of external subscriber ports 15. As is known in the art, a broadband signal is routed through a network, branching at multiple points to provide bi-directional signal communication between subscribers and the head end operated by the network provider. A feeder cable typically supplies signal and power to a plurality of distribution taps connected in series through terminals in the back box. Each back box 10 includes a power continuity bar 16 which ensures that the through signal path is maintained should the face plate fail or be removed to be replaced with a modified face plate. As back boxes are connected into the network power supply, it is difficult and time consuming to replace them. Therefore when network upgrades are required, for example to expand the operating frequency range, face plate 14 is removed and replaced with an updated face plate.

Figure 2:
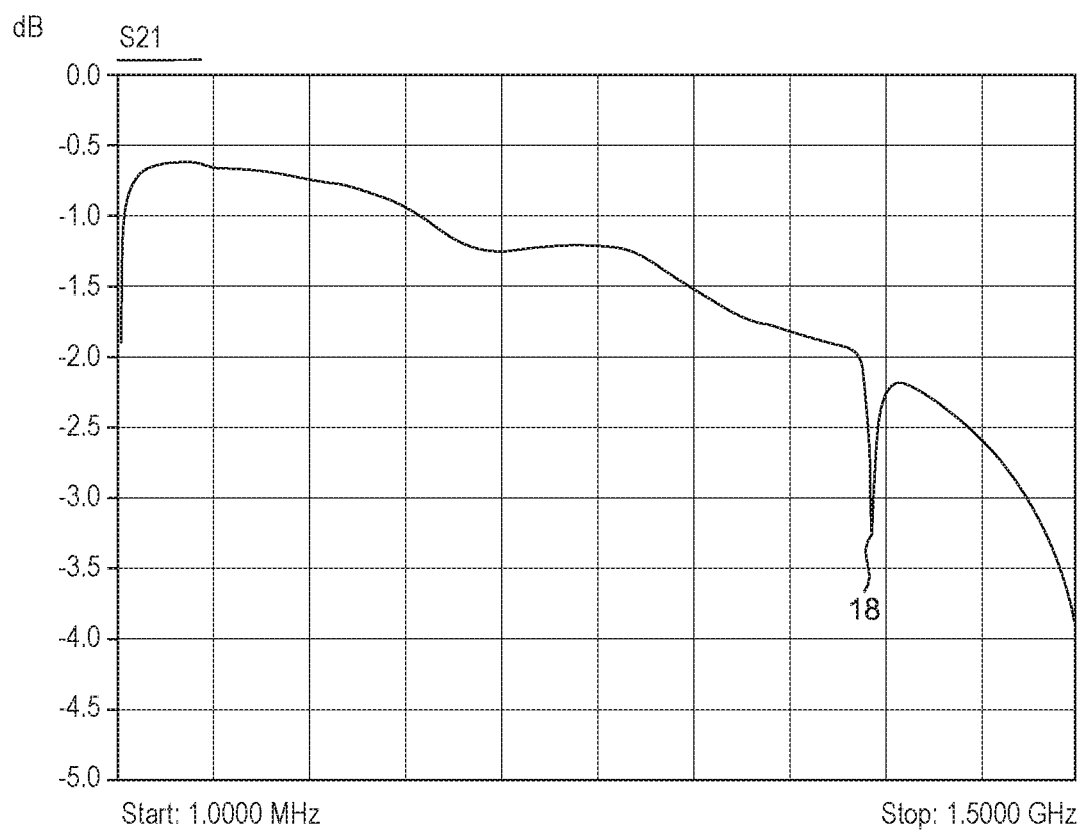
FIG. 2 shows a graph depicting resonant effects occurring in a broadband signal tap.

When updating face plates with newer face plates designed for a different frequency range to the existing installed back boxes, resonant effects can occur as shown in FIG. 2 where a graph of noise against frequency is shown and a resonant effect occurs at frequency 18, being 1173 MHz, where a notch in the signal can be seen. The resonant effect degrades the signal characteristics and occurs because electrical components in the back box react with the upgraded face plate components to form resonant circuits.

Figure 3:
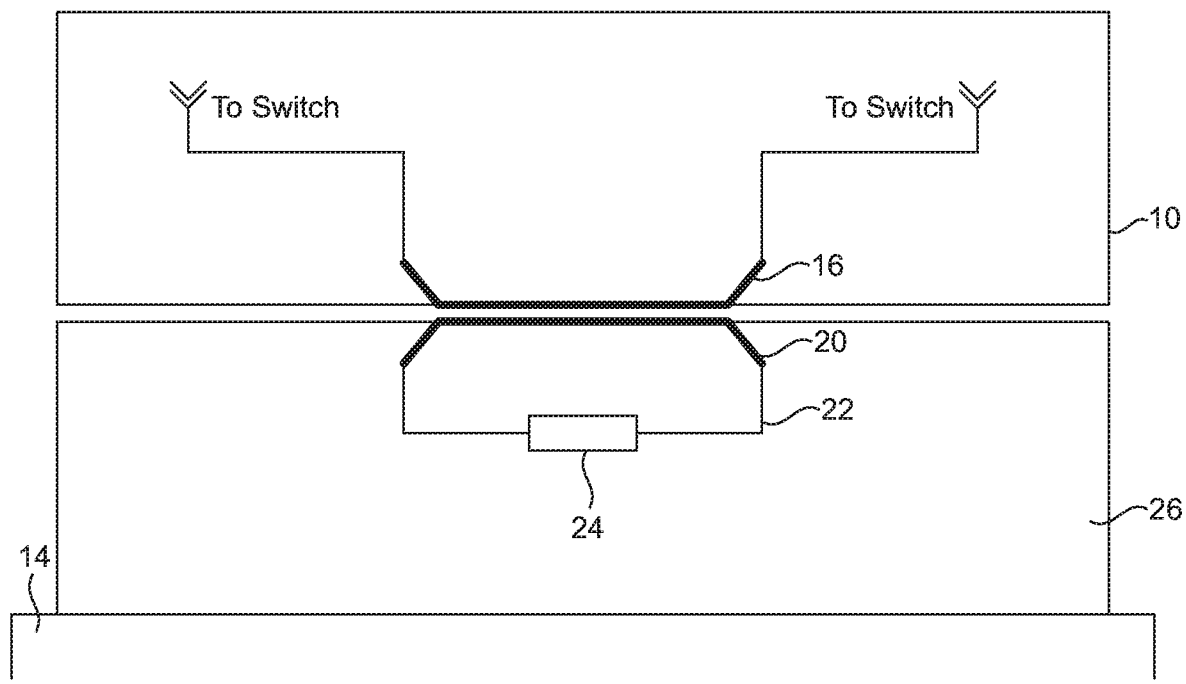
FIG. 3 shows a schematic diagram of an electrical configuration associated with the present disclosure.
Figure 4A:
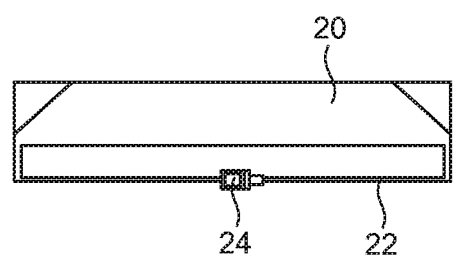
FIGS. 4(a) and (b) show a floating RF coupler used in accordance with the present disclosure.
Figure 4B:
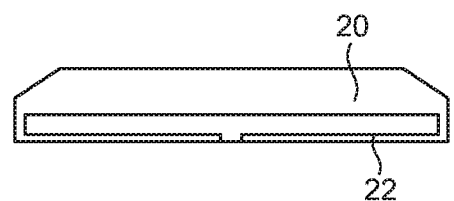

To substantially reduce the resonant effects, the present disclosure provides a floating RF coupler 20 unconnected to earth or any reference voltage and which is disposed proximal to power continuity bar 16, see FIG. 3. Floating RF coupler 20 is in the form of a copper track connected in a closed loop 22 to damping resistor 24. Typically, floating coupler 20 and damping resistor 24 are formed onto a printed circuit board 26, as shown in FIGS. 4(a) and (b) with the copper track being substantially trapezoid in shape and typically having a length of 50 mm and width of 8 mm. Damping resistor 24 can be selected to be of any appropriate value depending on the resonance frequency and coupling factor between copper track 20 and power connection bar 16, although for the arrangement shown a resistor of 1000 Ohms was used.

Figure 6:
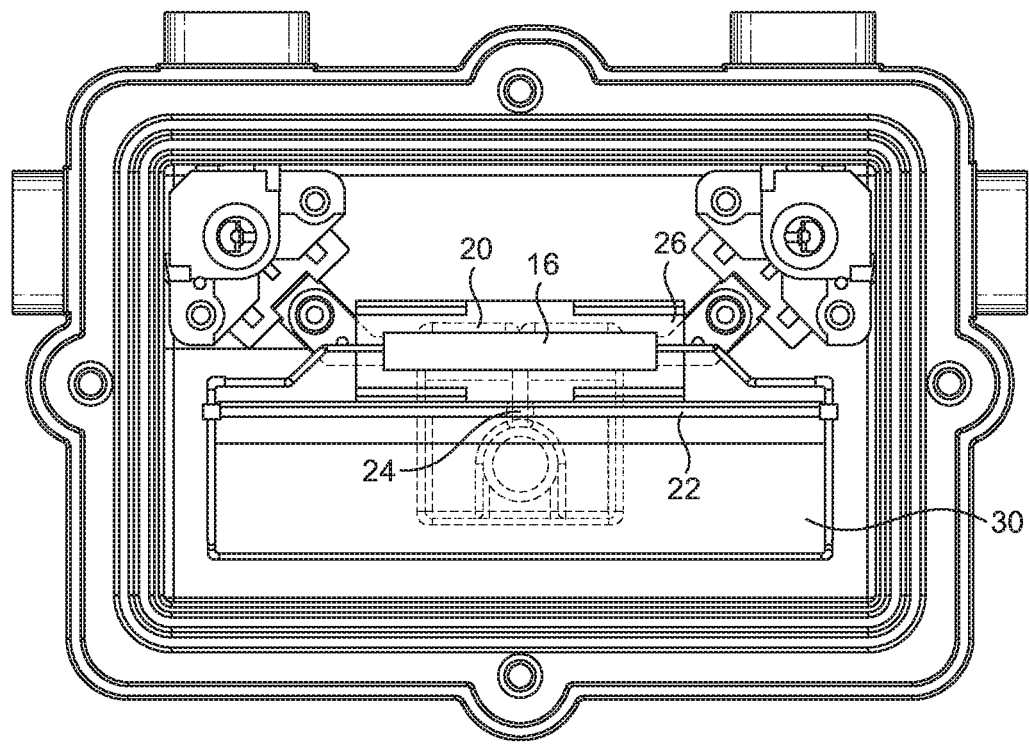
FIG. 6 shows a cut away plan view through a signal distribution tap showing the location of the RF coupler.
Figure 7:
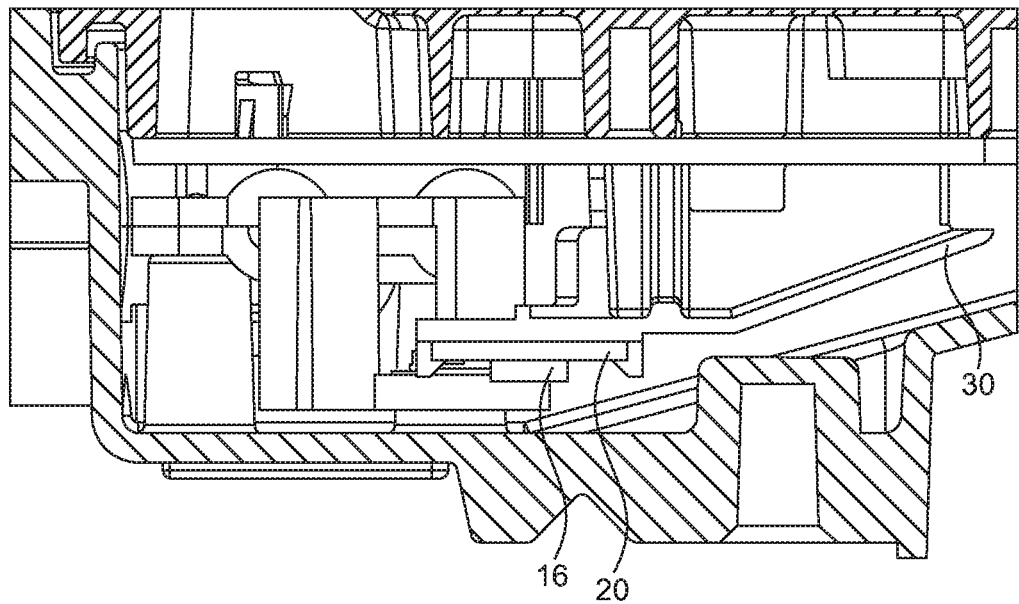
FIG. 7 shows an enlarged cross-section of the tap.

RF coupler 20 and its associated damping resistor 24 need to be disposed proximal to power continuity bar 16 if resonant effects are to be mitigated. Given the component that will be replaced during upgrades is face plate 14, typically floating coupler 20 and resistor 24 are glued or clipped onto an insulating plastics sheath 30 within face plate 14, see FIGS. 5 and 6, such that insulating sheath 30 is disposed between RF coupler 20 and any components on face plate 14 that might be affected by the RF coupler. RF coupler circuit 20 is typically formed as an additional printed circuit board that fits on top of insulating cover 30. When a modified face plate is connected to an existing back box within a network, floating RF coupler 20 and associated damping resistor 24 are positioned proximal to the power dissipating bar, see FIG. 7, such that RF coupler 20 is around 13-20 mm from power continuity bar 16, and typically there will be a distance of around 15 to 17 mm from the edge of printed circuit board 26 to the centre of bar 16.

The floating RF coupler 20 stops power passing switch components in the back box from forming resonant circuits with the face plate components within the signal pass band and so allows existing back boxes designed for 1000 MHz or lower to be used with face plates modified to operate for extended frequency bands of up to 1218 MHz or higher.

Figure 8:
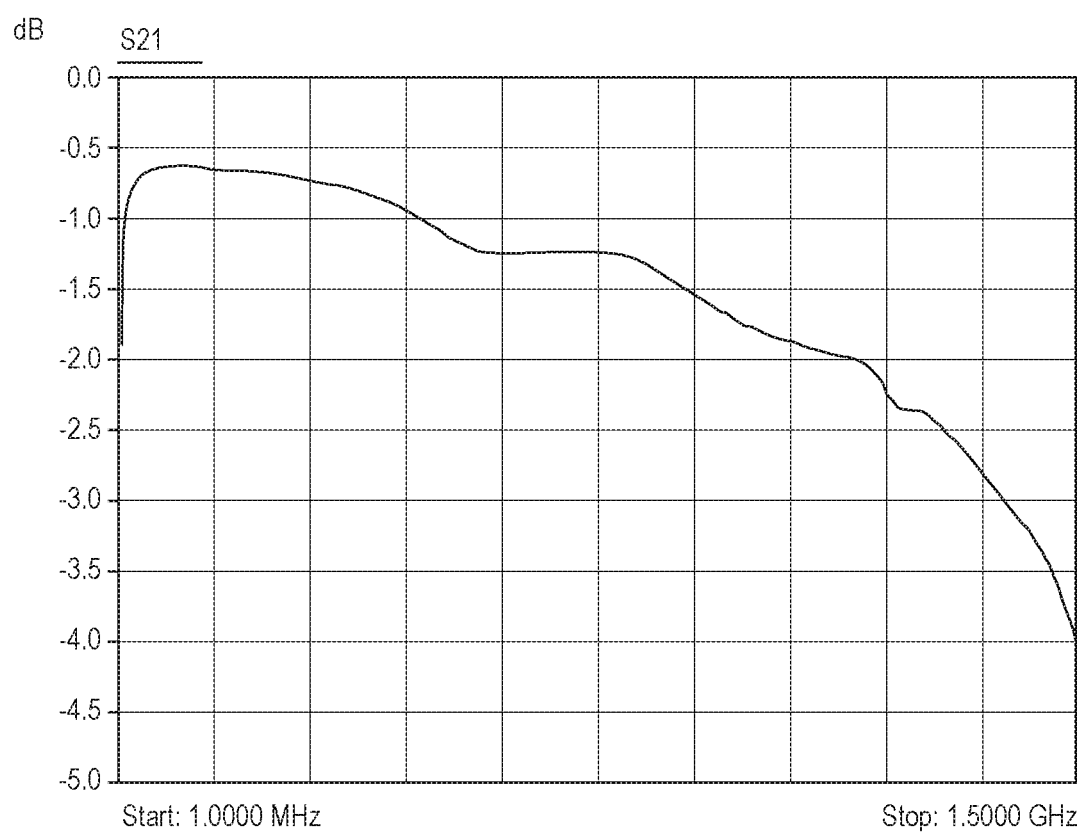
FIG. 8 shows a graph depicting the reduction in resonant effects within signals carried by the tap.

As can be seen in FIG. 8, the floating coupler circuit formed from coupler 20 and resistor 24 provides a 0.8 dB reduction to the notch, substantially improving the signal characteristics.

The invention claimed is:

1. A broadband signal tap comprising a housing and a cover adapted to be removable from and attachable to the housing, the housing comprising a power continuity connector and the cover comprising at least one external subscriber port, wherein a floating RF coupler is disposed proximal to the power continuity connector, and wherein the floating RF coupler is linked to a resistor.

2. The broadband signal tap according to claim 1, wherein the housing further comprises electrical components adapted to process signal frequencies in a first range and the cover further comprises electrical components adapted to process signal frequencies in a second range, the second range of frequencies extending beyond the first range of frequencies and partially overlapping with the first range of frequencies.

3. The broadband signal tap according to claim 2, wherein the first range has an upper limit of 1000 MHz and the second range extends to at least 1218 MHz.

4. The broadband signal tap according to claim 2, wherein the cover further comprises an insulating sheath with the floating RF coupler located on an outer face of the insulating sheath so as to be positionable proximal to the power continuity connector.

5. The broadband signal tap according to claim 1, wherein the floating coupler and linked resistor are formed on a printed circuit board.

6. The broadband signal tap according to claim 1, wherein the floating RF coupler consists of a copper track connected to a resistor, the copper track and the resistor forming a closed electrical path.

7. A cover for a broadband signal tap, the cover comprising electrical components, at least one external subscriber port and an insulating sheath disposed over the electrical components, wherein a floating RF coupler is located on an outer face of the insulating sheath so as to be electrically isolated from the electrical components within the sheath, and wherein the floating RF coupler is linked to a resistor.

8. The cover according to claim 7, wherein the floating RF coupler and linked resistor are formed on a printed circuit board.

9. The cover according to claim 7, wherein the floating RF coupler consists of a copper track connected to a resistor, the copper track and resistor forming a closed electrical path.

10. The cover according to claim 7, wherein the insulating sheath is shaped to ensure the floating RF coupler is positioned proximal to a power continuity connector when the cover is connected to a cable housing tap.

11. The cover according to claim 7, wherein the electrical components process signal frequencies extending to at least 1218 MHz.

12. A housing for a broadband signal tap comprising a power continuity connector and an insulating sheath on which is located a floating RF coupler so as to be proximal to the power continuity connector, wherein the floating RF coupler is linked to a resistor.

13. The housing according to claim 12, wherein the floating coupler and linked resistor are formed on a printed circuit board.

14. The housing according to claim 12, wherein the floating RF coupler consists of a copper track connected to a resistor, the copper track and the resistor forming a closed electrical path.

* * * * *